(12) United States Patent
Cheng (10) Patent No.: US 11,574,811 B2
(45) Date of Patent: Feb. 7, 2023

(54) TIGHT PITCH PATTERNING

(71) Applicant: International Business Machines Corporation, Armonk, NY (US)

(72) Inventor: Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/579,350

(22) Filed: Sep. 23, 2019

(65) Prior Publication Data

US 2021/0090889 A1    Mar. 25, 2021

(51) Int. Cl.
*H01L 21/22* (2006.01)
*H01L 21/033* (2006.01)
*H01L 21/3115* (2006.01)

(52) U.S. Cl.
CPC ...... *H01L 21/0337* (2013.01); *H01L 21/3115* (2013.01)

(58) Field of Classification Search
CPC .. H01L 21/22; H01L 21/0334; H01L 21/0337
See application file for complete search history.

(56) References Cited

U.S. PATENT DOCUMENTS

| | | | |
|---|---|---|---|
| 6,924,517 B2 | 8/2005 | Chen et al. | |
| 7,884,022 B2 | 2/2011 | Bai et al. | |
| 8,741,701 B2 | 6/2014 | Cheng et al. | |
| 9,589,845 B1 | 3/2017 | Jagannathan et al. | |
| 9,761,495 B1 | 9/2017 | Xie et al. | |
| 9,991,361 B2 | 6/2018 | Dai et al. | |
| 10,014,175 B2 | 7/2018 | Chang et al. | |
| 10,056,469 B1 | 8/2018 | Li et al. | |
| 10,177,037 B2 | 1/2019 | Zang et al. | |
| 2014/0051247 A1* | 2/2014 | Cheng | H01L 21/0337 438/689 |
| 2014/0057442 A1 | 2/2014 | Lee et al. | |
| 2018/0006138 A1* | 1/2018 | Cheng | H01L 21/3086 |
| 2018/0047575 A1* | 2/2018 | Cheng | H01L 21/3085 |

* cited by examiner

*Primary Examiner* — Jae Lee
(74) *Attorney, Agent, or Firm* — James Olsen; Michael J. Chang, LLC (57) ABSTRACT

Techniques for tight pitch patterning are provided. In one aspect, a patterning method includes: forming mandrels on a substrate; forming spacers that are undoped alongside the mandrels, wherein gaps are present between the spacers; filling the gaps with a sacrificial material having a dopant; forming a mask having an opening marking a cut region of at least one of the spacers; removing the sacrificial material from the cut region of the at least one spacer via the mask; removing the mask; performing an anneal to diffuse the dopant from the sacrificial material into the spacers to form doped spacers, wherein following the anneal the cut region of the at least one spacer remains undoped; removing the cut region of the at least one spacer selective to the doped spacers; and patterning features in the substrate using the doped spacers as a hardmask. A patterning structure is also provided.

19 Claims, 8 Drawing Sheets

(follows from FIG. 2)

TIGHT PITCH PATTERNING

FIELD OF THE INVENTION

The present invention relates to semiconductor device fabrication feature patterning, and more particularly, to techniques for tight pitch patterning in front-end-of-line (FEOL), middle-of-line (MOL) and/or back-end-of-line (BEOL) semiconductor fabrication processes.

BACKGROUND OF THE INVENTION

Tight pitch patterning has become increasingly essential in semiconductor fabrication. To ease patterning challenges, forming lines everywhere followed by cutting the lines into desired segments has become a primary approach. This approach of forming long lines followed by a cut has been widely adopted, for example, in front-end-of-line (FEOL) processing (fin cut, gate cut), in middle-of-line (MOL) processing (contact cut), and in back-end-of-line (BEOL) processing (metal line or narrow dielectric line cut).

In the ideal case, the cutting opening is perfectly aligned to the underlying lines. Unfortunately, however, due to the inherent variations in lithography overlay (OL) and critical dimension (CD), it is difficult to print the cut openings precisely. If the cut opening is too large, it may result in the undesired cutting of adjacent lines (i.e., excessive cut). On the other hand, if the cut opening is too small, it may undesirably result in incomplete cutting of the line (i.e., incomplete cut). Both an excessive cut and an incomplete cut cause chip yield issues.

Therefore, there is a need for improved tight pitch patterning techniques.

SUMMARY OF THE INVENTION

The present invention provides techniques for tight pitch patterning. In one aspect of the invention, a patterning method is provided. The method includes: forming mandrels on a substrate; forming spacers that are undoped alongside the mandrels, wherein gaps are present between the spacers alongside adjacent mandrels; filling the gaps with a sacrificial material having a dopant; forming a mask over the mandrels, the spacers and the sacrificial material, wherein the mask has an opening marking a cut region of at least one of the spacers; removing the sacrificial material from the cut region of the at least one spacer via the mask; removing the mask; performing an anneal to diffuse the dopant from the sacrificial material into the spacers to form doped spacers outside of the cut region, wherein following the anneal the cut region of the at least one spacer remains undoped; removing the cut region of the at least one spacer selective to the doped spacers; and patterning features in the substrate using the doped spacers as a hardmask.

In one aspect of the invention, a patterning structure is provided. The structure includes: a substrate; a patterned hardmask disposed on features formed in the substrate; and doped spacers having a cut region therein disposed on the patterned hardmask.

A more complete understanding of the present invention, as well as further features and advantages of the present invention, will be obtained by reference to the following detailed description and drawings.

DETAILED DESCRIPTION OF PREFERRED EMBODIMENTS

Provided herein are tight pitch patterning techniques that prevent the excessive cut and incomplete cut issues described above. As a result, the process window for patterning is greatly enlarged. Advantageously, the present techniques provide a broad patterning process that can be used in a variety of applications, regardless of the underlying structure.

As will be described in detail below, the present techniques leverage the selectivity of etchants such as ammonia and/or tetramethylammonium hydroxide (TMAH) for undoped semiconductor materials such as undoped silicon (Si) over their doped counterparts, such as boron-doped Si. For instance, undoped Si can be etched with ammonia or TMAH with an etch rate several orders of magnitude higher than boron-doped Si.

A couple of different scenarios will be presented below. In one scenario, the cut mask opening encroaches the pattern for an adjacent line. In the other, the cut mask opening only partially exposes the line pattern to be cut. Each of these scenarios would be problematic with conventional approaches. However, with the instant process, the patterning fidelity is not compromised in either case.

Figure 1:
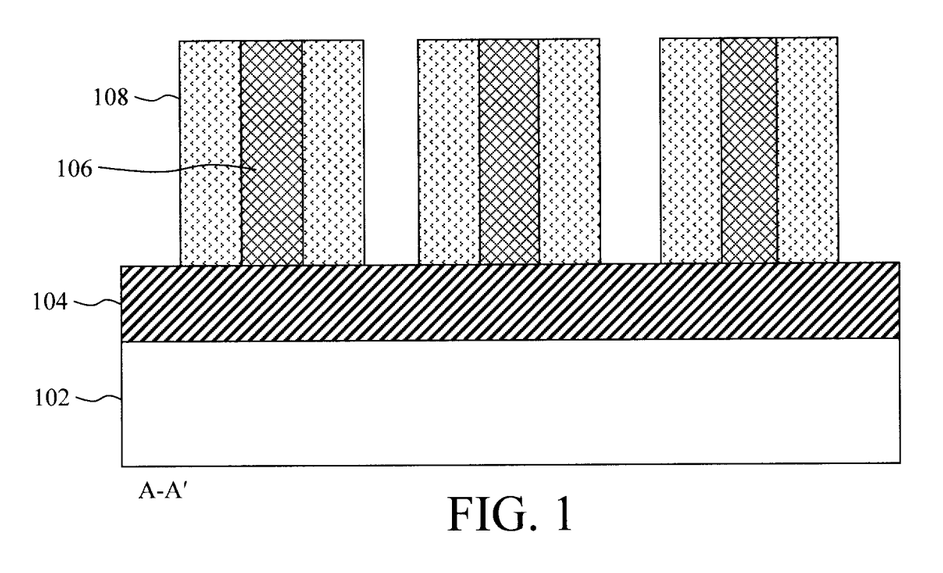
FIG. 1 is a cross-sectional diagram illustrating a substrate having a hardmask layer disposed thereon, and mandrels having been formed on the hardmask layer according to an embodiment of the present invention.

A first exemplary methodology for tight pitch patterning is now described by way of reference to FIGS. 1-12. As shown in FIG. 1, the process begins with a semiconductor substrate 102 having a hardmask layer 104 disposed thereon. According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 102 may already have pre-built structures (not shown) such as transistors, diodes, capacitors, resistors, isolation regions (e.g., shallow trench isolation (STI) regions), interconnects, wiring, etc. Suitable hardmask materials for layer 104 include, but are not limited to, nitride hardmask materials such as silicon nitride (SiN), silicon oxynitride (SiON), silicon carbide nitride (SiCN), and/or oxide hardmask materials such as silicon oxide (SiOx).

A mandrel layer is deposited onto hardmask layer 104 and then patterned into individual mandrels 106. According to an exemplary embodiment, mandrels 106 are formed from an undoped oxide material. Suitable undoped oxide materials include, but are not limited to, undoped silicon oxide (SiOx). Mandrels 106 can be patterned using a patterning technique such as lithography followed by an etching process. Suitable etching processes include, but are not limited to, a directional (anisotropic) etching process such as reactive ion etching (RIE). Alternatively, the mandrels 106 can be formed by other suitable techniques, including but not limited to, sidewall image transfer (SIT), self-aligned double patterning (SADP), self-aligned quadruple patterning (SAQP), and other self-aligned multiple patterning (SAMP).

As shown in FIG. 1, spacers 108 are then formed alongside opposite sidewalls of the mandrels 106. As provided above, the present techniques leverage the selectivity of etchants such as ammonia or TMAH for undoped semiconductor materials over their doped counterparts. Thus, according to an exemplary embodiment, spacers 108 are formed from an undoped semiconductor material. Suitable undoped semiconductor materials include, but are not limited to, undoped amorphous Si or polycrystalline Si. Spacers 108 can be formed by depositing the spacer material over the mandrels 106 and the substrate, followed by a directional etching process such as RIE to remove the spacer material from horizontal surfaces. Spacer material that remains on the sidewalls of the mandrel 106 forms individual spacers 108. As shown in FIG. 1, gaps are present between spacers 108 alongside adjacent mandrels 106.

Figure 2:
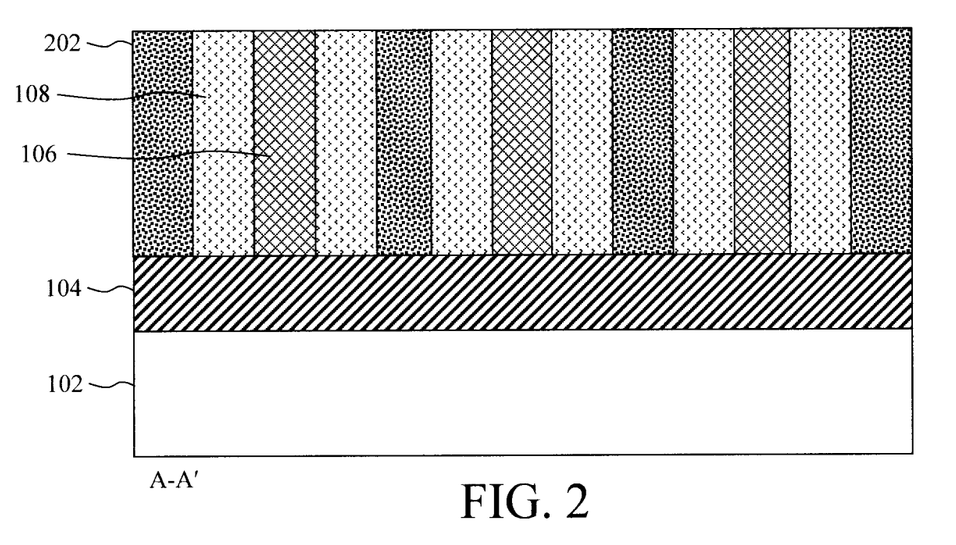
FIG. 2 is a cross-sectional diagram illustrating gaps in between the spacers having been filled with a sacrificial material according to an embodiment of the present invention.

The gaps in between spacers 108 are then filled with a sacrificial material 202. See FIG. 2. By 'sacrificial' it is meant that material 202 will be used as a dopant source and then removed later on in the process. According to an exemplary embodiment, sacrificial material 202 contains a dopant such as boron. Suitable boron-doped materials include, but are not limited to, boron-doped silicate glass (BSG) and/or boron-doped SiGe (SiGe:B). Sacrificial material 202 is deposited into and filling the gaps between spacers 108, followed by a polishing process such as chemical mechanical polishing (CMP) to recess the material down to mandrels 106/spacers 108 as shown in FIG. 2.

Figure 3:
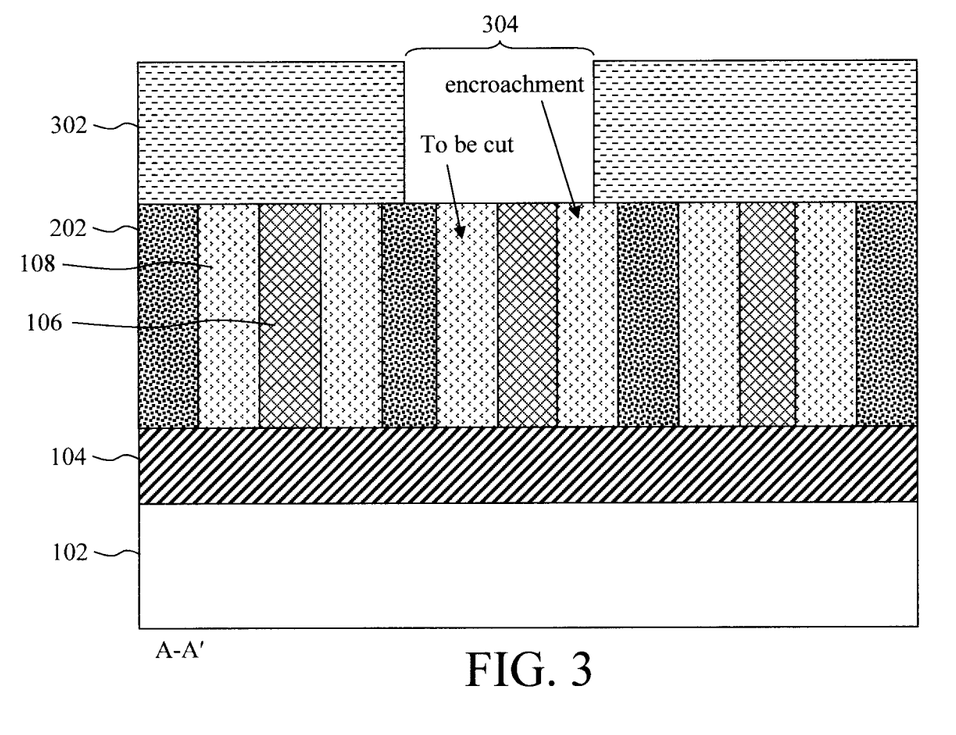
FIG. 3 is a cross-sectional diagram illustrating a cut mask having been formed over the mandrels/spacers/sacrificial material with an opening marking a region of at least one of the spacers that will be cut according to an embodiment of the present invention.

A cut mask 302 is formed over the mandrels 106/spacers 108/sacrificial material 202. See FIG. 3. As shown in FIG. 3, cut mask 302 has an opening 304 marking a footprint and location of a region of at least one of the spacers 108 that will eventually be cut (i.e., 'to be cut'). However, in this example, opening 304 also encroaches the adjacent spacer 108 (i.e., 'encroachment'). While such pattern encroachment would be a serious concern with conventional process flows, it is not a drawback in the instant approach.

Suitable materials for cut mask 302 include, but are not limited to, nitride materials such as SiN, SiON, SiCN, and/or oxide materials such as SiOx. Opening 304 is patterned in cut mask 302 using a patterning technique such as lithography followed by an etching process such as RIE.

Figure 4:
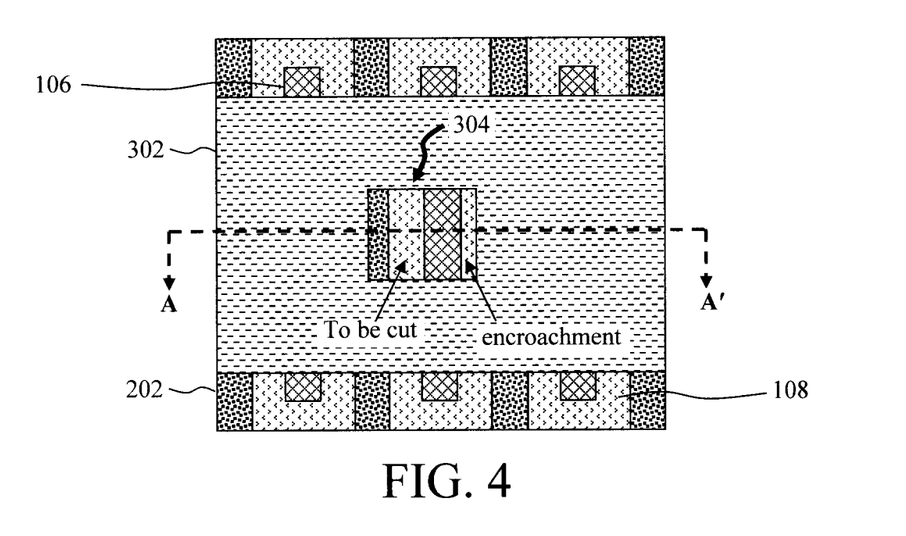
FIG. 4 is a top-down diagram illustrating the cut mask having been formed over the mandrels/spacers/sacrificial material with an opening marking a region of at least one of the spacers that will be cut, where the opening encroaches on an adjacent spacer according to an embodiment of the present invention.

FIG. 4 provides a top-down view of the patterning structure. Namely, the cross-sectional views provided herein depict cuts along the dashed line A-A' shown in the top-down view. As shown in FIG. 4, opening 304 in cut mask 302 marks the footprint and location of the cut region where the spacers 108 are 'to be cut', but also has 'encroachment' on the adjacent spacer 108.

Opening 304 in cut mask 302 enables the selective removal of the sacrificial material 202 and, e.g., undoped oxide, mandrels 106 from the sidewalls of spacers 108 in the cut region. As will become apparent from the description that follows, doing so prevents doping of the spacers 108 in the cut region, i.e., the spacers 108 in the cut region will remain undoped thereby providing for the etch selectivity that will be used for their selective removal (see below).

Figure 5:
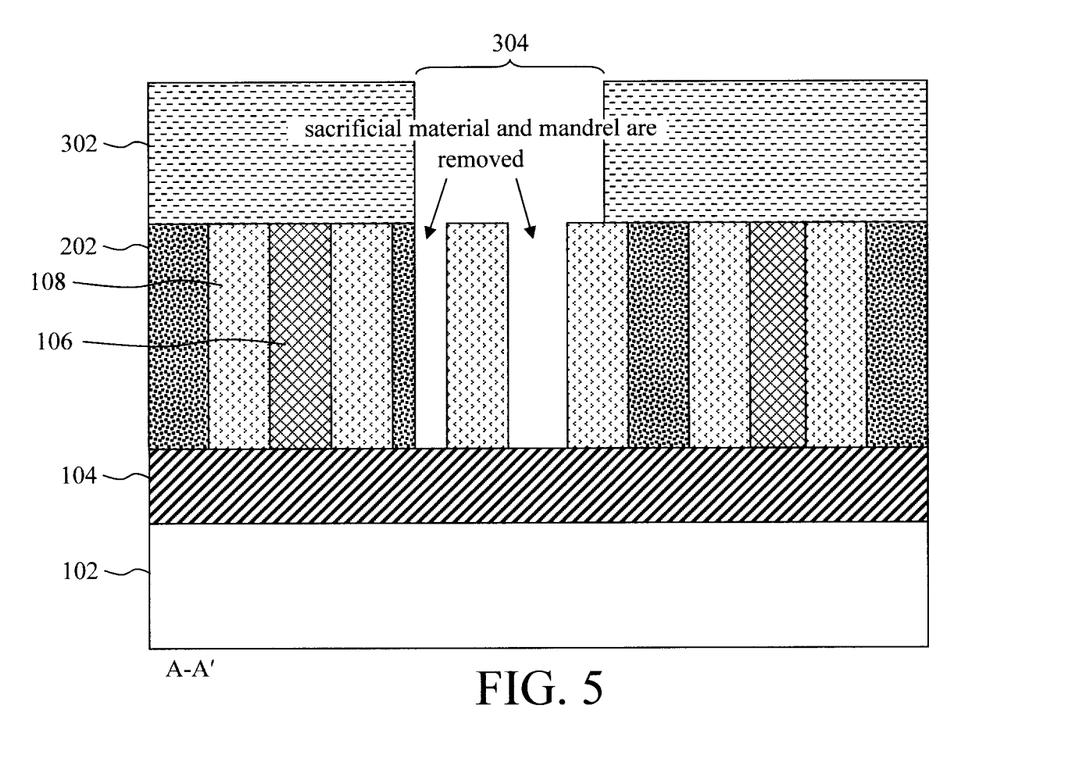
FIG. 5 is a cross-sectional diagram illustrating the sacrificial material and mandrels having been removed from the sidewalls of spacers in the cut region via the cut mask according to an embodiment of the present invention.
Figure 6:
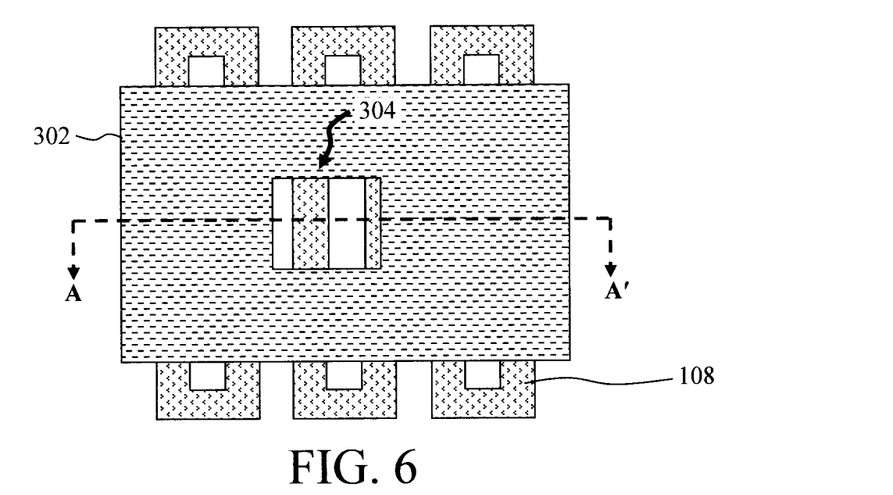
FIG. 6 is a top-down diagram illustrating the sacrificial material and mandrels having been removed from the sidewalls of spacers in the cut region via the cut mask according to an embodiment of the present invention.
Figure 7:
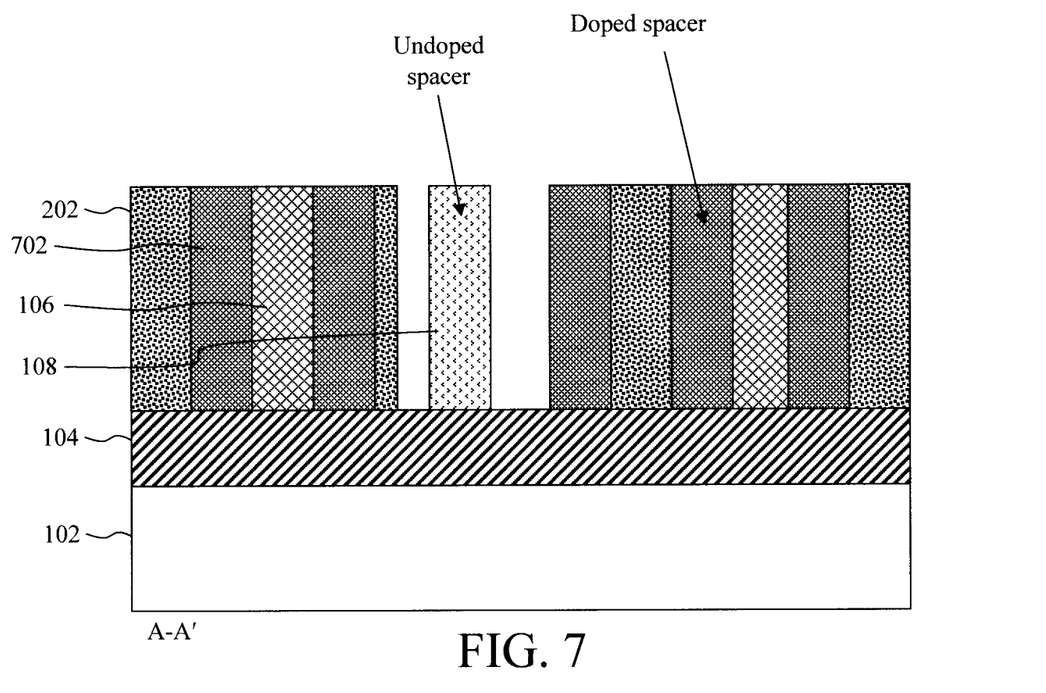
FIG. 7 is a cross-sectional diagram illustrating the cut mask having been removed and an anneal of the sacrificial material having been performed to diffuse the dopant from the sacrificial material into the adjacent spacers to form doped spacers outside of the cut region whereby a portion of the spacers in the cut region remains undoped according to an embodiment of the present invention.

Namely, as shown in FIG. 5 sacrificial material 202 is removed from the sidewalls of spacers 108 in the cut region via cut mask 302. As shown in FIG. 5, the mandrels 106 not covered by the cut mask 302 are also removed. Alternatively, only the sacrificial material 202 is removed. Notably, the spacers 108 remain intact in the cut region. FIG. 6 provides a top-down view of the patterning structure after the sacrificial material 202 and mandrels 106 have been removed from the sidewalls of spacers 108 in the cut region, as well as outside of the cut mask 302. According to an exemplary embodiment, a directional etch such as reactive ion etch (RIE) is used to remove sacrificial material 202 and mandrels 106 selective to spacers 108 in the cut region (i.e., a directional etch is needed so that doped sacrificial material will remain on the sidewall of the spacer 108 covered by the cut mask 302). For instance, by way of example only, a RIE process with CF4 and H2 plasma can be employed to remove sacrificial material 202 when it is oxide, leaving amorphous Si spacers 108 intact. When the sacrificial material 202 is SiGe:B, it can be selectively removed by using a RIE process with ClF3 plasma.

It is notable that, by comparison, conventional processes typically involve physically etching the spacers 108. However, doing so at this stage would also partially cut the adjacent spacer due to the encroachment which is undesirable.

Next, cut mask 302 is removed and an anneal of the sacrificial material 202 is performed to diffuse the dopant (e.g., boron) from sacrificial material 202 into the adjacent spacers 108 to form doped spacers 702 outside of the cut region. See FIG. 7. Notably, since sacrificial material 202 was previously removed from the sidewalls of spacers 108 in the cut region, the portion of spacers 108 in the cut region remains undoped. As described above, having an undoped spacer 108 in the cut region is important since it enables the selective removal of the undoped versus doped spacer 108. It is also notable that the portion of the adjacent spacer 108 partially exposed by the cut mask 302 (see, e.g., FIGS. 3 and 4 'Encroachment') is now doped since sacrificial material 202 remains as a dopant source along its opposite sidewall. According to an exemplary embodiment, the anneal is performed using a process such as furnace annealing, rapid thermal annealing (RTA), laser spike annealing, etc. at a temperature of from about 500° C. to about 900° C., and ranges therebetween.

Figure 8:
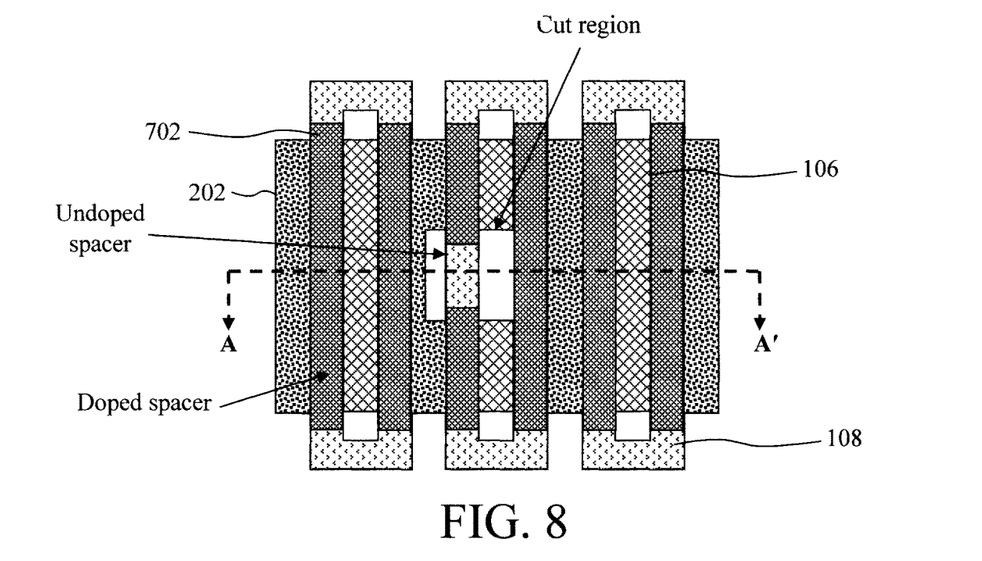
FIG. 8 is a top-down diagram illustrating the cut mask having been removed and an anneal of the sacrificial material having been performed to diffuse the dopant from the sacrificial material into the adjacent spacers to form doped spacers outside of the cut region according to an embodiment of the present invention.

FIG. 8 provides a top-down view of the patterning structure after formation of the doped spacers 702. While there is some lateral diffusion of the dopant from sacrificial material 202 into the cut region, the majority of the 'to be cut' portions of spacer 108 remains undoped.

Figure 9:
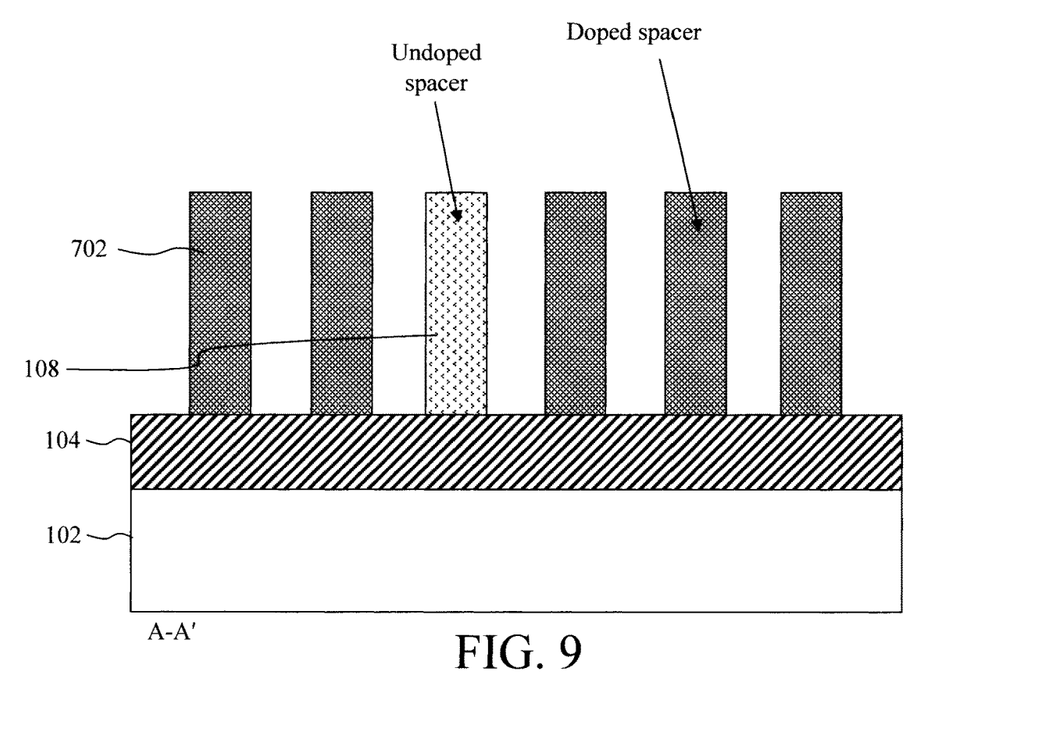
FIG. 9 is a cross-sectional diagram illustrating the sacrificial material and mandrels having been removed according to an embodiment of the present invention.
Figure 10:
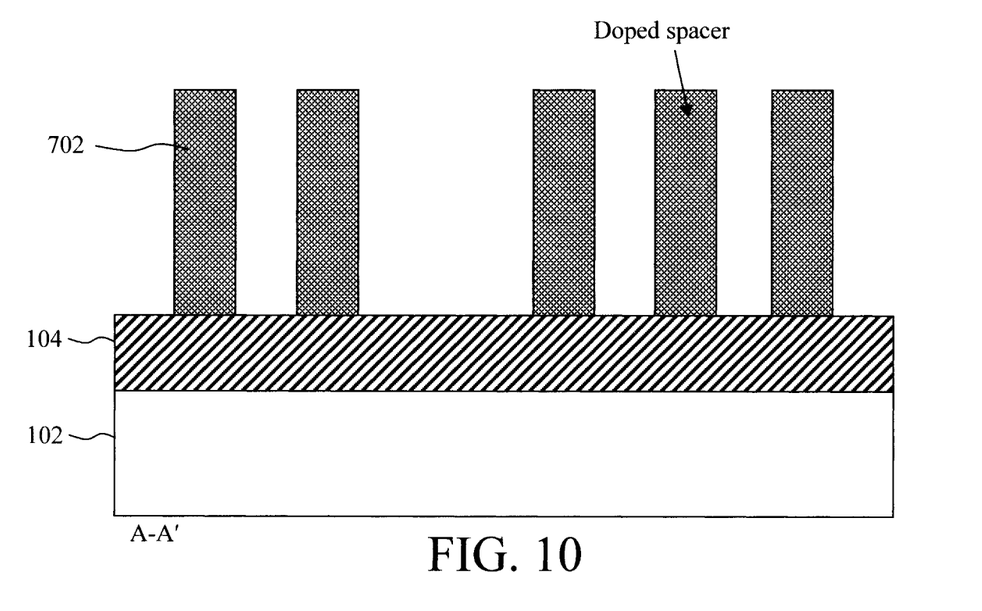
FIG. 10 is a cross-sectional diagram illustrating the undoped portions of the spacers having been removed selective to the doped spacers according to an embodiment of the present invention.

The sacrificial material 202 and mandrels 106 are then removed. See FIG. 9. For instance, when the sacrificial material 202 is oxide, hydrofluoric acid (HF) can be employed to remove it, leaving spacers 108 intact (i.e., the etch process in this step can be isotropic, so either a wet etch or a dry etch can be used). When the sacrificial material 202 is SiGe:B, it can be selectively removed by using a wet etch solution containing HF, hydrogen peroxide (H2O2) and acetic acid (CH3COOH). Alternatively, SiGe:B can be selectively removed by a gas phase hydrogen chloride (HCl). Selective dry etch such as plasma etching can also be used to remove the sacrificial material 202 and the mandrels 106. As shown in FIG. 9, what remains are undoped 'to be cut' portions of spacer 108 (in the cut region—see, e.g., FIG. 8) and doped spacers 702 outside of the cut region.

Figure 11:
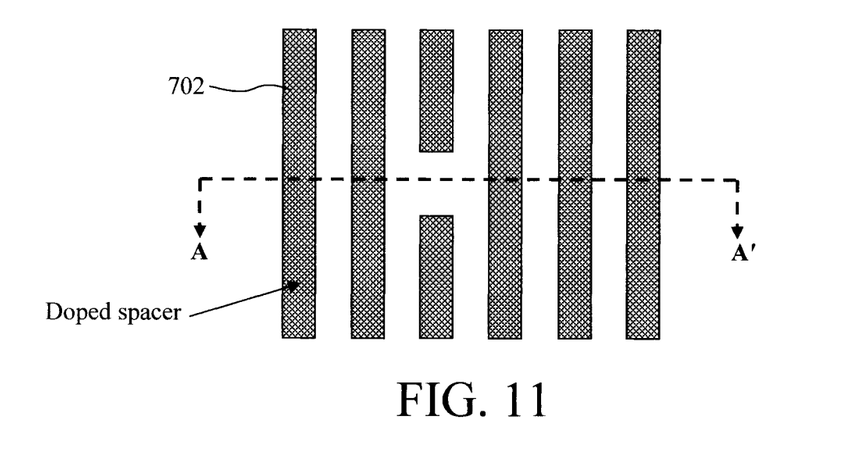
FIG. 11 is a top-down diagram illustrating the undoped portions of the spacers having been removed selective to the doped spacers according to an embodiment of the present invention.

The undoped 'to be cut' portions of spacers 108 are then removed selective to the doped spacers 702. See FIG. 10. As provided above, the undoped portions of spacers 108 can be removed using an etchant such as ammonia and/or TMAH which provides an etch rate several orders of magnitude higher than for doped spacers 702. It is notable that, even though cut mask 302 had partially encroached the adjacent spacer (see above), by way of the present process the integrity of the pattern is maintained, and only the 'to be cut' portions of spacers 108 have been removed. FIG. 11 provides a top-down view of the patterning structure after undoped 'to be cut' portions of spacers 108 have been selectively removed. All that remains of the pattern are the doped spacers 702.

Figure 12:
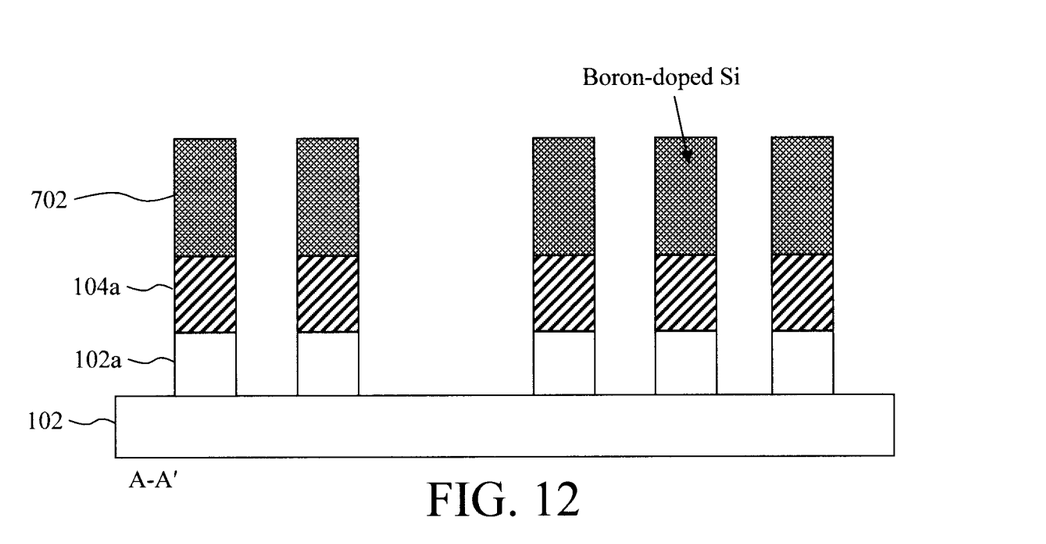
FIG. 12 is a cross-sectional diagram illustrating the doped spacers having been used to pattern the hardmask layer forming a patterned hardmask, and the pattern from the patterned hardmask having been transferred to substrate forming features in the substrate according to an embodiment of the present invention.

Doped spacers 702 are then used as a hardmask to pattern the underlying layers. Patterning can be carried out using lithography followed by an etching process such as RIE. For instance, as shown in FIG. 12, doped spacers 702 are used to pattern hardmask layer 104 forming patterned hardmask 104a. The pattern from hardmask 104a is then transferred to substrate 102 forming features 102a (e.g., lines) in substrate 102. The lines can be semiconductor fins, gates, conductive contacts, back-end-of-line (BEOL) wires, or any other structures for semiconductor devices.

In the example just described, the cut mask opening encroached the pattern for an adjacent line. The case may also arise where the cut mask opening only partially exposes the line pattern to be cut. However, with the present techniques for tight pitch patterning, the patterning fidelity is not compromised. This scenario is now described by way of reference to FIGS. 13-15.

The process begins in the same manner as in the example above with a semiconductor substrate 102 having a hardmask layer 104 disposed thereon, mandrels 106 formed on the hardmask layer 104, spacers 108 formed along opposite sidewalls of the mandrels 106, and a sacrificial material 202 in the gaps between spacers 108. See description of FIG. 1 and FIG. 2, above. Like structures are numbered alike in the description and drawings. As provided above, according to an exemplary embodiment, mandrels 106 are formed from an undoped oxide material such as undoped SiOx, spacers 108 are formed from an undoped semiconductor material such as undoped amorphous Si, and the sacrificial material 202 contains a dopant such as boron. For instance, suitable boron-doped materials include, but are not limited to, BSG and/or SiGe:B.

Figure 13:
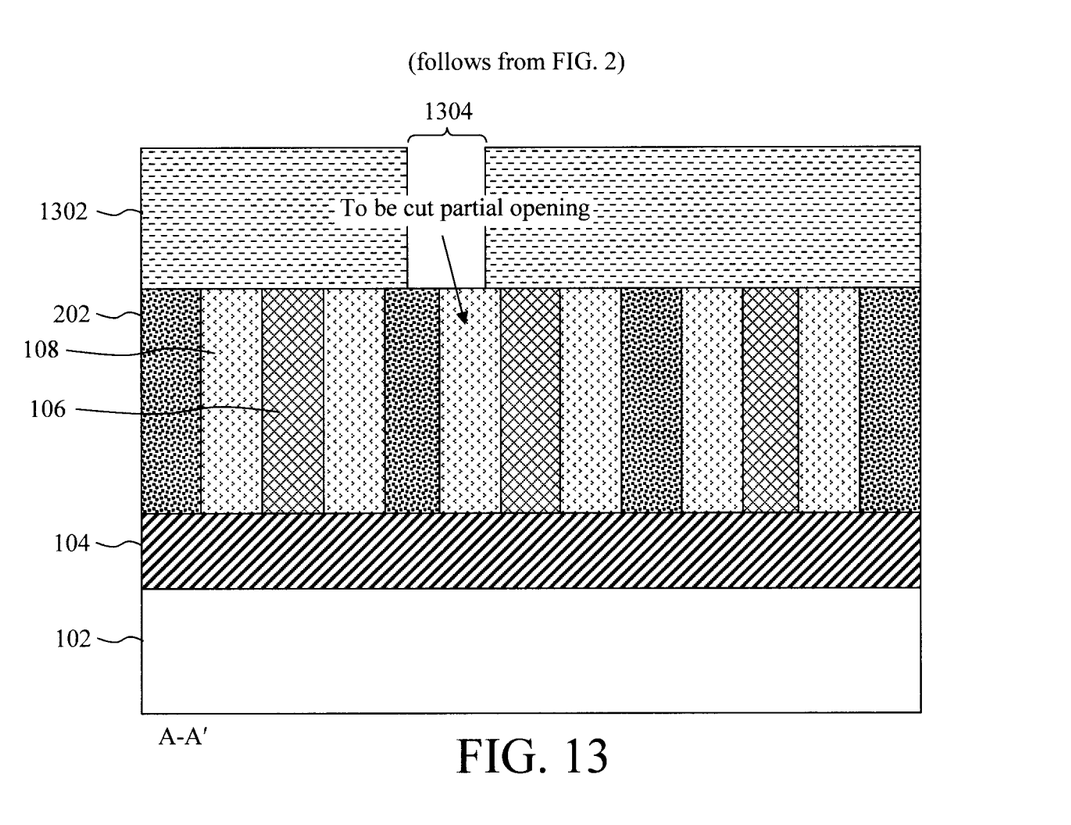
FIG. 13 is a cross-sectional diagram illustrating, according to an alternative embodiment which follows from FIG. 2, a cut mask having been formed over the mandrels/spacers/sacrificial material with an opening marking a cut region where the spacers will eventually be removed, where the opening only partially exposes the spacers to be cut according to an embodiment of the present invention.

Following from FIG. 2, as shown in FIG. 13 a cut mask 1302 is formed over the mandrels 106/spacers 108/sacrificial material 202. As above, cut mask 1302 has an opening 1304 marking a footprint and location of a cut region where the spacers 108 will eventually be removed (i.e., 'to be cut'). However, in this example, opening 1304 only partially exposes the spacers 108 to be cut (i.e., 'partial opening'). While such a partial opening would be a serious concern with conventional process flows, it is not a drawback in the instant approach.

As above, suitable materials for cut mask 1302 include, but are not limited to, nitride materials such as SiN, SiON, SiCN, and/or oxide materials such as SiOx. Opening 1304 is patterned in cut mask 1302 using a patterning technique such as lithography followed by an etching process such as RIE.

Opening 1304 in cut mask 1302 enables the selective removal of the sacrificial material 202 from the sidewalls of spacers 108 in the cut region. Doing so prevents doping of the spacers 108 in the cut region, i.e., the spacers 108 in the cut region will remain undoped thereby providing for the etch selectivity that will be used for their selective removal (see below).

Figure 14:
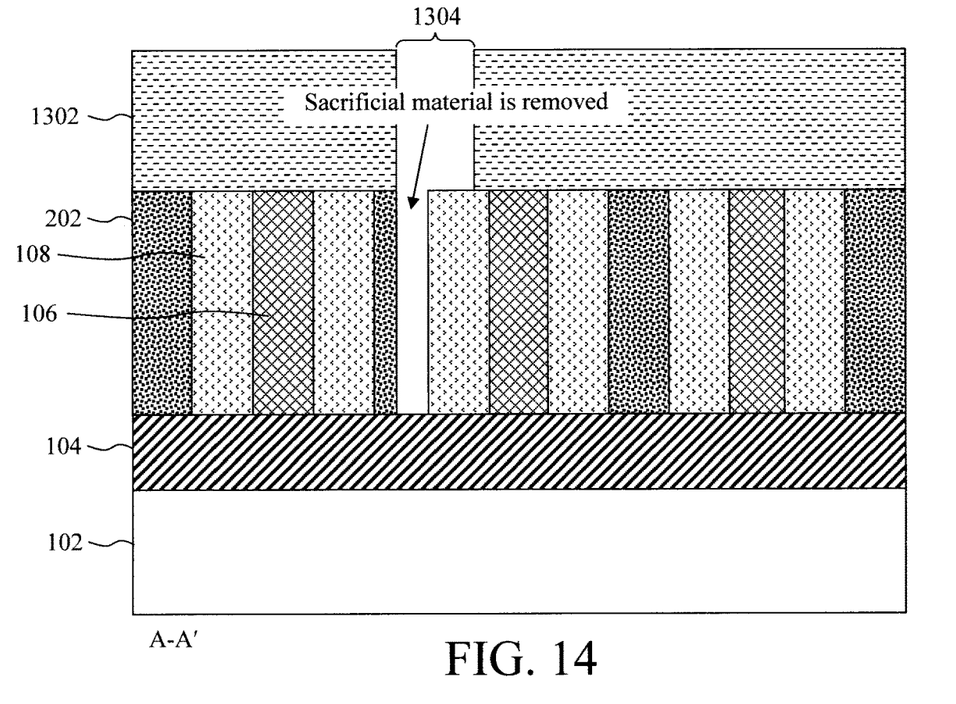
FIG. 14 is a cross-sectional diagram illustrating the sacrificial material having been removed from the sidewalls of spacers in the cut region via the cut mask according to an embodiment of the present invention.
Figure 15:
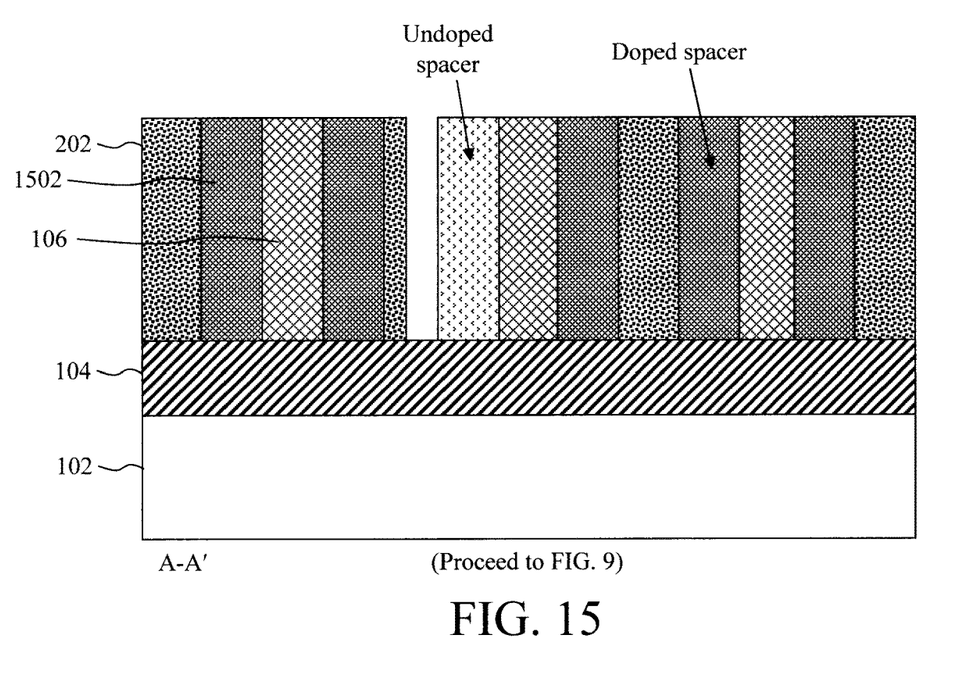
FIG. 15 is a cross-sectional diagram illustrating the cut mask having been removed and an anneal having been performed to diffuse the dopant from the sacrificial material into the adjacent spacers to form doped spacers, with a remainder of the process being the same as in FIGS. 9-12, according to an embodiment of the present invention.

Namely, as shown in FIG. 14 sacrificial material 202 is removed from the sidewalls of spacers 108 in the cut region via cut mask 1302. Because opening 1304 only partially exposes the spacers 108 to be cut, the adjacent mandrels 106 are not removed. This is in contrast to the example above where both the sacrificial material 202 and the mandrels 106 have been removed from the sidewalls of spacers 108 in the cut region. However, what is important is that the sacrificial material 202 be removed from the sidewalls of spacers 108 in the cut region thereby enabling the spacers 108 in the cut region to remain undoped.

As above, according to an exemplary embodiment, a selective directional etch such as RIE is used to remove sacrificial material 202 selective to spacers 108 in the cut region. For instance, by way of example only, a RIE process with CF4 and H2 plasma can be employed to remove sacrificial material 202 when it is oxide, leaving amorphous Si spacers 108 intact. When the sacrificial material 202 is SiGe:B, it can be selectively removed by using a RIE process with ClF3 plasma.

It is notable that, by comparison, conventional processes typically involve physically etching the spacers 108. However, doing so at this stage would only partially cut spacers 108 in the cut region which is undesirable.

Next, cut mask 1302 is removed and an anneal is performed to diffuse the dopant (e.g., boron) from sacrificial material 202 into the adjacent spacers 108 to form doped spacers 1502. See FIG. 15. Notably, since sacrificial material 202 was previously removed from the sidewalls of spacers 108 in the cut region, the portion of spacers 108 in the cut region remains undoped. As described above, having an undoped spacer 108 in the cut region is important since it enables the selective removal of the undoped versus doped spacer 108. According to an exemplary embodiment, the anneal is performed using a process such as furnace annealing, RTA, laser spike annealing, etc. at a temperature of from about 500° C. to about 900° C., and ranges therebetween.

The remainder of the process is the same as described in conjunction with the description of FIGS. 9-12, above. Thus, proceeding from FIG. 15 to the structure shown in FIG. 9, the sacrificial material 202 and mandrels 106 are then removed such that what remains are undoped 'to be cut' portions of spacer 108 (in the cut region—see, e.g., FIG. 8) and doped spacers 702 outside of the cut region. See FIG. 9. The undoped 'to be cut' portions of spacers 108 are then removed selective to the doped spacers 702. See FIGS. 10 and 11. The undoped portions of spacers 108 can be selectively removed using an etchant such as ammonia or TMAH which provides an etch rate several orders of magnitude higher than for doped spacers 702. The doped spacers 702 are then used as a hardmask to pattern the underlying layers. For instance, doped spacers 702 are used to pattern hardmask layer 104 forming patterned hardmask 104a. The pattern from hardmask 104a is then transferred to substrate 102 forming features 102a (e.g., lines) in substrate 102. See FIG. 12.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of patterning, the method comprising:
forming mandrels on a substrate;
forming spacers that are undoped alongside the mandrels, wherein gaps are present between the spacers alongside adjacent mandrels;
filling the gaps with a sacrificial material comprising a dopant;
forming a mask over the mandrels, the spacers and the sacrificial material, wherein the mask has an opening marking a cut region of at least one of the spacers;
removing the sacrificial material from the cut region of the at least one spacer via the mask;
removing the mask;
performing an anneal to diffuse the dopant from the sacrificial material into the spacers to form doped spacers outside of the cut region, wherein following the anneal the cut region of the at least one spacer remains undoped;
removing the cut region of the at least one spacer selective to the doped spacers; and
patterning features in the substrate using the doped spacers as a hardmask.

2. The method of claim 1, wherein a hardmask layer is disposed on the substrate, and wherein the mandrels are formed on the hardmask layer.

3. The method of claim 2, wherein the patterning of the features in the substrate comprises:
patterning the hardmask layer using the doped spacers; and
transferring a pattern from the hardmask layer to the substrate to form the features in the substrate.

4. The method of claim 1, wherein the mandrels comprise an oxide material that is undoped.

5. The method of claim 1, wherein the spacers are formed from a semiconductor material.

6. The method of claim 1, wherein the semiconductor material comprises amorphous silicon (Si).

7. The method of claim 1, wherein the dopant comprises boron, and wherein the sacrificial material is selected from the group consisting of: boron-doped silicate glass (BSG), boron-doped SiGe (SiGe:B), and combinations thereof.

8. The method of claim 1, wherein the anneal is performed at a temperature of from about 500° C. to about 900° C., and ranges therebetween.

9. The method of claim 1, wherein the opening encroaches an adjacent spacer.

10. The method of claim 9, further comprising:
removing the mandrels from the cut region of the at least one spacer via the mask.

11. The method of claim 1, wherein the opening only partially exposes the cut region of the at least one spacer.

12. The method of claim 1, wherein the cut region of the at least one spacer is removed selective to the doped spacers using an etchant selected from the group consisting of: ammonia, tetramethylammonium hydroxide (TMAH), and combinations thereof.

13. A method of patterning, the method comprising:
forming mandrels on a substrate, wherein the mandrels comprise oxide material that is undoped;
forming spacers that are undoped alongside the mandrels, wherein the spacers are formed from a semiconductor material, and wherein gaps are present between the spacers alongside adjacent mandrels;
filling the gaps with a sacrificial material comprising a dopant, wherein the dopant comprises boron, and wherein the sacrificial material is selected from the group consisting of: BSG, SiGe:B, and combinations thereof;
forming a mask over the mandrels, the spacers and the sacrificial material, wherein the mask has an opening marking a cut region of at least one of the spacers;
removing the sacrificial material from the cut region of the at least one spacer via the mask;
removing the mask;
performing an anneal to diffuse the dopant from the sacrificial material into the spacers to form doped spacers outside of the cut region, wherein following the anneal the cut region of the at least one spacer remains undoped;

removing the cut region of the at least one spacer selective to the doped spacers; and patterning features in the substrate using the doped spacers as a hardmask.

14. The method of claim 13, wherein a hardmask layer is disposed on the substrate, and wherein the mandrels are formed on the hardmask layer.

15. The method of claim 14, wherein the patterning of the features in the substrate comprises:

patterning the hardmask layer using the doped spacers; and transferring a pattern from the hardmask layer to the substrate to form the features in the substrate.

16. The method of claim 13, wherein the semiconductor material comprises amorphous Si.

17. The method of claim 13, wherein the opening encroaches an adjacent spacer.

18. The method of claim 17, further comprising:

removing the mandrels from the cut region of the at least one spacer via the mask.

19. The method of claim 13, wherein the opening only partially exposes the cut region of the at least one spacer.

\* \* \* \* \*